United States Patent
Hill

(10) Patent No.: US 6,924,697 B2
(45) Date of Patent: Aug. 2, 2005

(54) SEMICONDUCTOR DEVICE AND METHOD THEREOF

(75) Inventor: Darrell Hill, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/375,542

(22) Filed: Feb. 27, 2003

(65) Prior Publication Data

US 2004/0169556 A1 Sep. 2, 2004

(51) Int. Cl.[7] ................................................. H03G 3/20
(52) U.S. Cl. ....................................... 330/140; 330/286
(58) Field of Search ................................. 330/140, 295, 330/124 R, 84, 286, 54

(56) References Cited

U.S. PATENT DOCUMENTS

| 5,274,339 A | * | 12/1993 | Wideman et al. ............. 330/54 |
| 6,265,943 B1 | | 7/2001 | Dening et al. |
| 2002/0139998 A1 | * | 10/2002 | Dueme et al. ............... 257/200 |

* cited by examiner

*Primary Examiner*—Henry Choe
(74) *Attorney, Agent, or Firm*—Toler, Larson & Abel, LLP

(57) ABSTRACT

A signal along a voltage reference bus of an RF device is rectified to provide an indication of the amplitudes of the RF voltage swings that are the result of rapidly varying RF currents. The indication is proportional to the peak RF currents through the RF device and is proportional to the output power under matched load conditions.

26 Claims, 4 Drawing Sheets

SEMICONDUCTOR DEVICE AND METHOD THEREOF

BACKGROUND

Many wireless transmitter systems require that a specified radio frequency (RF) output power be monitored. For example, some portable wireless transmitter systems require that power delivered to the radiating antenna be monitored. Further, many such systems are required to adjust the transmitted power to achieve a specific level depending upon signal strength. To meet the aforesaid requirements, the system architectures generally incorporate a closed-loop power control scheme. Typically, this scheme requires a "sampling" of the RF power amplifier output power that is subsequently fed back to predetermined control circuitry which generates a control signal that adjusts the output power until it is within the specified power level. Such sampling of the output power is disadvantageous in that it increases the insertion loss between the output of the power amplifier and the radiating antenna. Therefore, sampling of the output power decreases the available output power from the power amplifier and reduces the overall talk time available to portable wireless devices. Talk time is a measure of the time a portable transceiver can be in the "talk" mode before the battery is fully depleted. The power amplifier consumes the majority of the current and therefore dominates in the calculation of talk time.

A common technique for sampling the output power includes the use of a directional coupler on the output of the power amplifier. The power coupled from the main signal path is diode detected to generate a video signal proportional to the amplitude of the RF voltage delivered to the antenna. Use of directional couplers, however, adds loss to the system, forcing the power amplifier to consume more power thereby reducing the talk time of the associated radio unit. In typical applications, the aforesaid loss is often 5–10% of the power amplifier output power and relates to a direct loss in available talk time.

Another common technique for detecting the output power includes measurement of the current consumed by the power amplifier. This current is directly related to the output power generated by the power amplifier and is also fed back to predetermined power control leveling circuitry. This technique is also disadvantageous due to the loss associated with the current measurement. This current measurement generally requires that a series "dropping" element be added between the associated battery and the power amplifier bias input. The voltage across this element will determine the current entering the power amplifier (for a known resistance across the element). In typical applications, the voltage across the dropping element will be about 3% of the total battery voltage. Because this is a loss in the input power to the power amplifier, the loss of talk time will be even higher than 3% due to the less than 100% dc-rf conversion efficiency of the power amplifier. For example, if the power amplifier efficiency is 60%, then the talk time loss will be 3/0.6+L or 5%.

Thus, there remains a need for a new and improved technique for current sensing associated with RF amplifier power detection.

FIELD OF THE DISCLOSURE

The present disclosure relates generally to semiconductor devices, and more particularly to a device and method for current sensing.

BRIEF DESCRIPTION OF THE DRAWINGS

The present invention may be better understood, and its features, and advantages made apparent to those skilled in the art by referencing the accompanying drawings.

DETAILED DESCRIPTION OF THE DRAWINGS

Devices having high operating frequencies, such as RF power amplifiers, generate rapidly varying RF currents. These rapidly varying currents can generate RF voltage swings on conductors that are coupled to fixed reference voltages. The present disclosure detects the amplitudes of RF voltage swings that are a result of the rapidly varying RF currents, and provides a signal that is proportional to the peak RF current through the device. Since, under matched load conditions, the RF current is proportional to the output power, this technique can be used for power detection.

By using this technique, a compact, low cost, power detection apparatus can be realized for closed loop power control. The present disclosure can be better understood with reference to FIGS. 1 through 7 herein.

Figure 1:
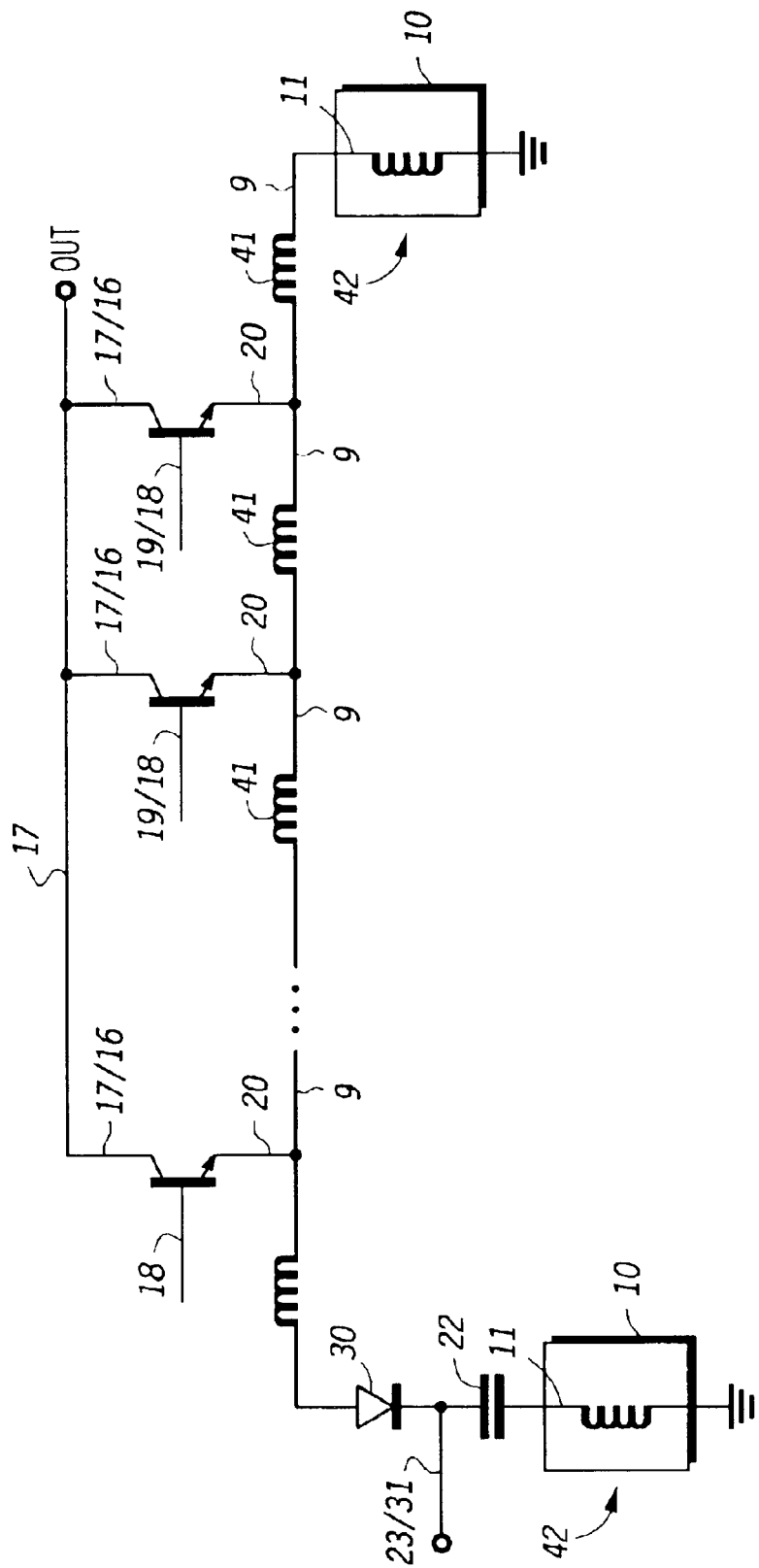
FIG. 1 illustrates a circuit in accordance with a specific embodiment of the present disclosure.

FIG. 1 illustrates a specific circuit embodiment in accordance with the present disclosure. The circuit illustrated in FIG. 1 generally represents a power amplifier circuit. Power amplifier circuits, such as the type illustrated in FIG. 1, generally have a power output of one-half watt, or greater, and operate at a frequency of greater than 500 MHz and typically operate at frequencies in excess of 1 GHz. The circuit illustrated in FIG. 1 comprises a plurality of transistors coupled in parallel, as is typical of power amplifiers. For example, bipolar power transistors, such as those represented in FIG. 1, will typically have anywhere from a few transistors, for example ten, to hundreds of transistors coupled in parallel. The transistors illustrated in FIG. 1 each have: a collector electrode 16 coupled to the collector connectors 17, which further acts as an output node; a control electrode 18 or base electrode 18, which acts as an input or a control node; and an emitter electrode 20 that is coupled to a voltage reference bus 9, or a ground bus. It will be appreciated, that for the sake of specificity, this description uses a specific embodiment where a bipolar transistor is used, thereby having emitters coupled to the voltage reference bus. However, it will be appreciated that the technique described herein is applicable to other device technologies and to other grounding configurations.

The voltage reference bus 9 is coupled to the emitter of each transistor to carry current to and from each of the transistor devices and to a substrate via 10. At high frequencies, the inherent inductance of the voltage reference bus 9 can be observed and is illustrated in FIG. 1 by inductor symbols that are referred to herein as inherent inductances 41. The inherent inductances 41 result in voltage drops along the voltage reference bus, whereby the further away from the substrate via 10 that a transistor is located, the greater the voltage drop will generally be. By detecting this voltage drop, caused by rapidly varying currents, it is possible to determine the amount of power being used by the circuit of FIG. 1.

In order to detect the voltage drop on the bus 9, the signal is rectified at a point of the voltage reference bus 9 using the diode 30. Specifically, the anode of diode 30 is coupled to the voltage reference bus 9, and the cathode of diode 30 is coupled to a first terminal of a capacitor 22, the capacitor 22 having a second terminal coupled to a substrate via 10.

The substrate via 10 represents a conductive structure providing contact to a reference voltage, such as ground. Substrate via 10, at high frequencies, comprises a via inductance 42, and a via contact portion 11. The via contact 11 acts as a voltage reference node that contacts the voltage reference bus 9.

It will be appreciated that while common numbering has been applied to two substrate vias 10, one connected to the capacitor 22 and the other to the voltage reference bus 9, that those two substrate vias 10 can represent the same substrate via or separate substrate vias. This will be better understood with subsequent reference to FIG. 2.

In operation, an input signal is received at the control electrode 18 of each of the transistors of FIG. 1. In response, an oscillating current at high frequency is generated, resulting in a voltage drop on voltage reference bus 9 that will typically be greater the further away from the connection between the voltage reference bus 9 and the substrate via 10. This voltage drop is rectified using the diode 30. An output terminal coupled to the connection between the diode 30 and the capacitor 22 provides a peak voltage indicator, from which the power usage of the system can be determined.

Figure 2:
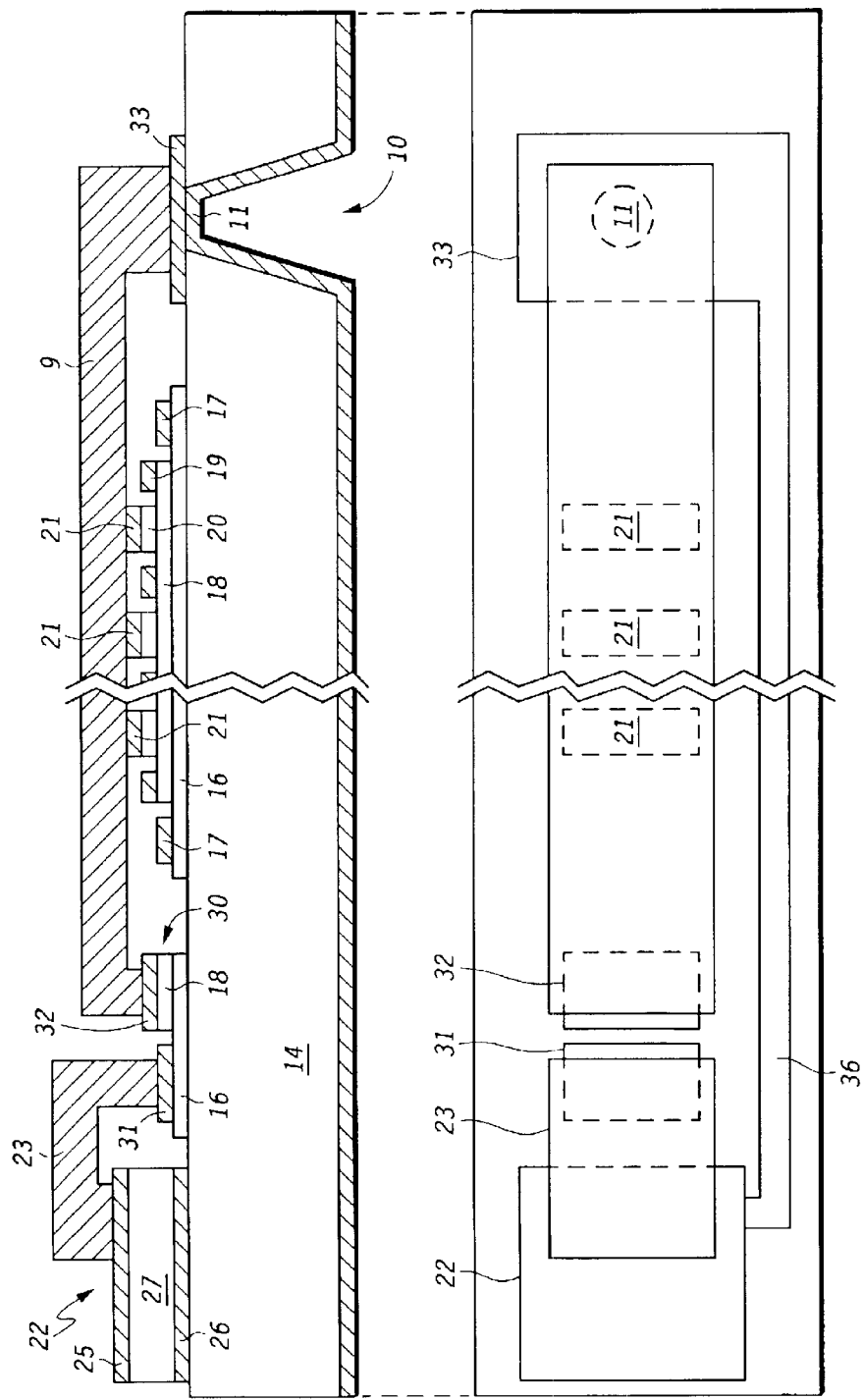
FIG. 2 illustrates a cross-sectional view and a plan view of a specific embodiment of the circuit of FIG. 1.

FIG. 2 illustrates a cross-sectional, and plan view of a device corresponding to the circuit of FIG. 1. The embodiment illustrated in FIG. 2 represents a gallium arsenide die. The gallium arsenide die comprises a substrate 14, having a conductive layer 12 formed on its underside to form a voltage reference plane 12. A substrate via 10 has been formed through the substrate 14 that comprises an opening formed through the substrate 14, a portion of the conductive layer 12 that is within the opening, and via contact portion 11, also part of the conductive layer 12, that contacts with an overlying catch pad 33.

Coupled to the catch pad 33 is the voltage reference bus 9 that is coupled to the emitters 20 of a plurality of transistor devices through emitter contacts 21. A plurality of base connectors 19 are coupled to a portion of the base layer 18 of the transistors. Likewise, a plurality of collector connectors 17 are illustrated coupled to a collector layer 16 of the transistors.

The voltage reference bus 9 is further coupled to the anode of diode 30 where the anode is formed by a portion of base layer 18. The cathode of the diode, formed from collector layer 16, is coupled to the capacitor 22 through conductive structure 23. The capacitor 22 is formed having conductive plates 25 and 26 on either side of a dielectric layer 27. Not specifically illustrated in the cross sectional view of FIG. 2 is a conductive trace coupling the conductive plate 26 of the capacitor 22 back to a portion of the voltage reference bus 9 near the via contact 11, or to the via contact 11.

The plan view of FIG. 2 illustrates a conductive trace 36 that couples the lower conductive plate 26 of the capacitor 22 back to the via contact 11. The embodiment illustrated in FIG. 2 has a single via contact 11. It will be appreciated, in other embodiments additional via contacts 11 could be formed. For example, a via contact could be formed, relative to the illustration of FIG. 2, to the left of the capacitor 22. Whether common or different via contacts 11 are used, providing a separate path back to the via contact 11, such as through the conductive trace 36, it is possible to rectify the changing signal occurring at a location of the voltage reference bus 9 sufficiently far away from the via contact 11, for example at a location of the voltage reference bus 9 near, or coupled to, catch pad 32. Note that while not specifically illustrated in FIG. 2, an output terminal will typically be coupled somewhere along the conductive structure 23 to provide an output representation of the peak voltage detected.

Figure 3:
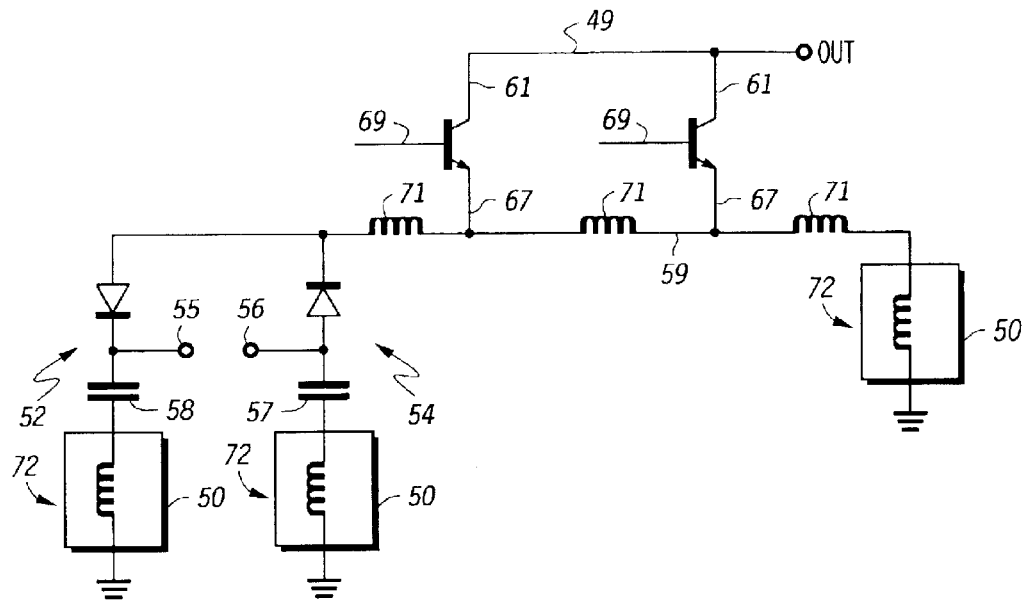
FIGS. 3 and 4 illustrate, in circuit diagram form, specific embodiments of the present disclosure.

FIG. 3 illustrates an alternate embodiment of the present disclosure. Specifically, FIG. 3 contains analogous components to those illustrated in FIG. 1. Node 49 represents the common collector node of a plurality of transistors. The plurality of transistors includes a common base electrodes 69, common collector electrodes 61, and common emitter electrodes 67. The common emitter electrodes 67 are coupled to a voltage reference bus 59, which is illustrated to have inherent inductances 71 at high frequencies. Substrate vias 50 are illustrated as being coupled to the voltage reference bus 59, as well as to the capacitors 58 and 57. The first diode 52 has its anode coupled to the voltage reference bus 59, and its cathode coupled to the capacitor 58. A second diode 54 has its cathode coupled to the voltage reference bus 59 and its anode coupled to the capacitor 57. Differential output terminals 55 and 56 are coupled to the cathode of diode 52 and the anode of diode 54 respectively.

Figure 4:
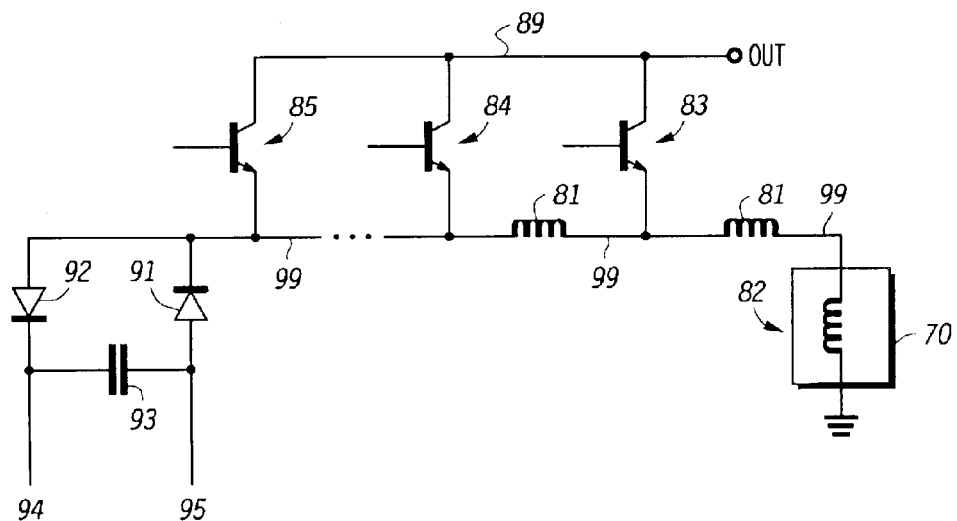

FIG. 4 illustrates yet another embodiment of the present disclosure. Labeled components in FIG. 4 include substrate via 70 having an inherent conductance 82 at high frequencies, voltage reference bus 99, transistors 83 through 85, a common collector output node 89, and diodes 92 and 91. The diodes 92 and 91 have an anode and cathode coupled to the voltage reference bus 99 respectively. In addition, the diodes 92 and 91 have a capacitor 93 coupled to their cathode and anode respectively. In this manner, the capacitor 93 acts as a storage element between the diodes and does not require connections returning to near the via 70. Therefore, output terminals 94 and 95 can be coupled to opposing conductive plates of the capacitor 93 to provide a differential signal representing the peak-to-peak voltage from which the power consumption of the device can be determined. To prevent diminution of the differential signals due to the same type of inductance effects, the diodes will typically couple to approximately the same location of the voltage reference bus 99 so that they receive substantially the same signal. The term "approximately the same location" includes points a distance of 5 millimeters apart, or less.

Figure 5:
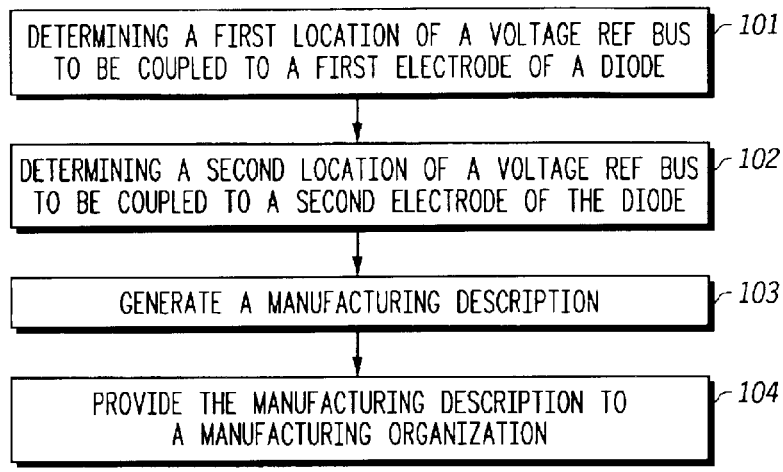
FIGS. 5 and 6 illustrate, in flow diagram form, methods in accordance with the present disclosure.

FIG. 5 illustrates a flow diagram of a specific method in accordance with the present disclosure. In step 101 a determination is made as to where along a voltage reference bus that a first electrode of a diode is to be coupled. With reference to FIG. 2, the first location would be that portion of the voltage reference bus 9 overlying the catch pad 32. This is a good location for the first location because the catch pad 32 is coupled to the voltage reference bus 9 at a point furthest away from the via contact 11 where the voltage drop can be expected to be largest.

At step 102, a determination is made where along the voltage reference bus that the second electrode of the diode is to be coupled. With reference to FIG. 2, the second location would be that portion of the voltage reference bus 9 overlying the catch pad 33. The area near catch pad 33 is a good selection for coupling to the second electrode of the diode through capacitor 22 in that this area will have a relatively stable voltage reference since is close to the via contact 11.

At step 103, a manufacturing description is generated identifying information to facilitate the manufacture of a device having the diode connections of steps 101 and 102. It will be appreciated that many kinds of manufacturing descriptions may exist that include the appropriate design specification files needed to aide in the manufacturing of such a device. The manufacturing description is stored onto an information storage media.

At step 104, the manufacturing description is provided to a manufacturing organization for manufacturing. Based upon the manufacturing specification, the manufacturing organization will produce a device meeting the specifications thereby creating a device having a rectifying diode as described herein.

Figure 6:
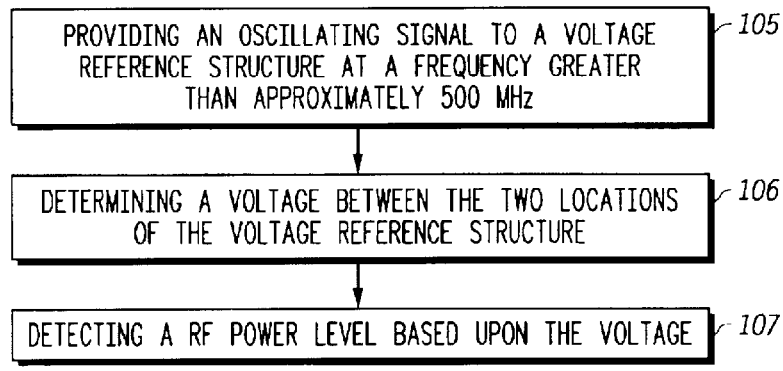

FIG. 6 illustrates a flow diagram in accordance with another embodiment of the present disclosure. At step 105, an oscillating signal is provided to a voltage reference structure at a frequency of greater than 500 MHz. For example, with reference to FIG. 1, the oscillating signal would be provided to the voltage reference bus 9 in response to receiving a high frequency input at the control electrodes 18. The high frequency input would result in an oscillating current on the voltage reference bus 9.

At step 106, a voltage is determined between two locations of the voltage reference structure. With respect to FIG. 1, the voltage difference between a point near the substrate contact 11 and the anode of the diode 30 would be determined.

In step 107, an RF power level would be detected based upon the voltage determined in FIG. 106.

Figure 7:
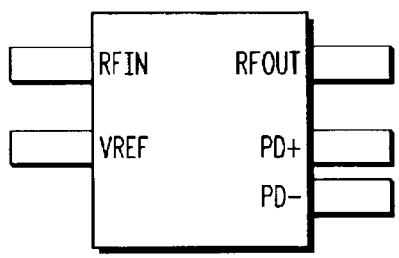
FIG. 7 illustrates a packaged device in accordance with a specific embodiment of the present disclosure.

FIG. 7 illustrates a packaged device in accordance with the present disclosure. Specifically, FIG. 7 illustrates a power amplifier device having a differential power detection pin pair. The differential power detection pin pair includes power detect pins labeled PD+ and PD−, a control pin labeled $RF_{IN}$, a current input, or voltage reference pin, labeled $V_{REF}$, and a current output pin labeled $RF_{OUT}$. With reference to the circuit of FIG. 3, the pin labeled $RF_{IN}$ would be coupled to the control electrodes 69, the pin labeled $V_{REF}$ would be coupled to the substrate via 10 to provide the voltage reference. The pin labeled $RF_{OUT}$ would be coupled to the common collectors of the transistors. And the power detect pins would be coupled to the terminals 55 and 56.

It will be appreciated that the present disclosure addresses the need for a compact low cost power detection method and apparatus for use in closed power control. Compared to the prior art the present disclosure allows for a smaller, low cost option having few parts and less adverse impact on amplifier performance. By not requiring power couplers, which are large and introduce losses, efficiency is gained.

The various functions and components in the present application may be implemented using an information handling machine such as a data processor, or a plurality of processing devices. Such a data processor may be a microprocessor, microcontroller, microcomputer, digital signal processor, state machine, logic circuitry, and/or any device that manipulates digital information based on operational instruction, or in a predefined manner. Generally, the various functions, and systems represented by block diagrams are readily implemented by one of ordinary skill in the art using one or more of the implementation techniques listed herein. When a data processor for issuing instructions is used, the instruction may be stored in memory. Such a memory may be a single memory device or a plurality of memory devices. Such a memory device may be a read-only memory device, a random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic. Such an information handling machine may be a system, or part of a system, such as a computer, a personal digital assistant (PDA), a hand held computing device, a cable set-top box, an Internet capable device, such as a cellular phone, and the like.

In the preceding detailed description of the figures, reference has been made to the accompanying drawings which form a part thereof, and in which is shown by way of illustration specific embodiments in which the disclosure may be practiced. These embodiments are described in sufficient detail to enable those skilled in the art to practice the disclosure, and it is to be understood that other embodiments may be utilized and that logical, mechanical, chemical and electrical changes may be made without departing from the spirit or scope of the disclosure. To avoid detail not necessary to enable those skilled in the art to practice the disclosure, the description may omit certain information known to those skilled in the art. Furthermore, many other varied embodiments that incorporate the teachings of the disclosure may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the disclosure. The preceding detailed description is, therefore, not to be taken in a limiting sense, and the scope of the present disclosure is defined only by the appended claims.

What is claimed is:

1. A semiconductor device comprising:
   a voltage reference node;
   a voltage reference bus coupled to the voltage reference node wherein the voltage reference bus is to provide substantially constant reference voltage;
   a first diode having a first electrode coupled to a first location of the voltage reference bus and a second electrode coupled to a second location of the voltage reference bus, wherein the first location is closer to the voltage reference node than the second location.

2. The semiconductor device of claim 1, wherein the voltage reference node is a ground reference node for receiving a ground reference.

3. The semiconductor device of claim 1 further comprising:
   an output terminal coupled to the first electrode of the first diode.

4. The semiconductor device of claim 3 further comprising:
   a package comprising
      an input node to receive a signal to be amplified;
      a first output node to receive a power amplified signal, where the power amplified signal is based on the signal;
      a reference node coupled to the voltage reference node to provide a voltage reference; and
      a second output node coupled to the output terminal.

5. The semiconductor device of claim 3 further comprising:
   a capacitive element coupled between the output terminal of the first diode and the voltage reference node.

6. The semiconductor device of claim 1 further comprising:
a second diode having a first electrode coupled to a third location of the voltage reference bus and a second electrode coupled to a fourth location of the voltage reference bus, wherein the third location is closer to the voltage reference node than the fourth location.

7. The semiconductor device of claim 6, wherein the first electrode of the first diode and the second electrode of the second diode are of a common polarity type.

8. The semiconductor device of claim 7 further comprising:
a first capacitive element coupled between the first electrode of the first diode and the voltage reference node;
a second capacitive element coupled between the first electrode of the second diode and the voltage reference node;
a first output terminal coupled to the first electrode of the first diode; and
a second output terminal coupled to the first electrode of the second diode.

9. The semiconductor device of claim 6, wherein the second location and the fourth location are approximately the same location.

10. The semiconductor device of claim 9, wherein the second location is within 5 millimeters of the fourth location.

11. The semiconductor device of claim 1 further comprising:
an input node;
an output node; and
a plurality of transistors, a first current electrode of each of the plurality of transistors coupled to the voltage reference bus, a second current electrode of each of the plurality of transistors coupled to the output node, and a control node of each of the plurality transistors coupled to the input node.

12. The semiconductor device of claim 11, wherein the plurality of transistors comprises at least ten transistors.

13. A packaged power amplifier comprising:
a current output;
a control node to receive an input signal to be amplified as an output signal at the current output; and
a first power detect output to provide a signal indicative of a power output level of the output signal.

14. The packaged power amplifier of claim 13 further comprising a second power detect output, wherein a differential power detect signal is provided between the second power detect output and the first power detect output.

15. A method comprising:
rectifying a first signal between a first location of a conductive structure and a second location of the conductive structure, wherein the conductive structure couples a plurality of transistor nodes in parallel as part of a power transistor; and
determining a peak voltage between the first location and the second location, based on the rectifying, to monitor a radio frequency (RF) power level.

16. The method of claim 15 further comprising:
rectifying a second signal between a third location of the conductive structure and a fourth location of the conductive structure; and
wherein determining comprises determining a peak to peak voltage based on rectifying the first signal and rectifying the second signal.

17. The method of claim 16, wherein rectifying the second signal between the third location and the fourth location comprises the first signal and the second signal being substantially identical.

18. The method of claim 16, wherein rectifying the second signal between the third location and the fourth location comprises the second location and the third location being substantially identical.

19. The method of claim 15, wherein rectifying the first signal further comprises using a voltage reference bus as the conductive structure.

20. The method of claim 19, wherein rectifying the first signal further comprises using a ground voltage node as the conductive structure.

21. A method comprising:
providing an oscillating signal to a voltage reference structure at a frequency greater than approximately 500 MHz;
determining a voltage between two locations of a ground structure; and
detecting a radio frequency power level based upon the voltage.

22. The method of claim 21, wherein determining comprises rectifying the voltage.

23. The method of claim 21, wherein providing further comprises providing an oscillating current to the voltage reference structure where the voltage reference structure is a ground reference structure.

24. The semiconductor device of claim 1, further comprising:
a capacitor having a first electrode coupled to the second electrode of the first diode and a second electrode coupled to the second location of the voltage reference; and
wherein the second electrode of the first diode is coupled to the second location of the voltage reference via the capacitor.

25. An amplifier comprising:
a voltage reference bus;
a plurality of transistors coupled in parallel, each transistor having an electrode coupled to the voltage reference bus; and
means for detecting a power output of the amplifier based at least in part on a measured difference between a voltage at a first location of the voltage reference bus and a voltage at a second location of the voltage reference bus.

26. The amplifier of claim 25, wherein the means for detecting the power output comprises a diode having a first electrode coupled to the voltage reference bus at the first location and a second electrode coupled to the voltage reference bus at the second location.

* * * * *